(12) United States Patent
Lin

(10) Patent No.: US 6,399,887 B1
(45) Date of Patent: Jun. 4, 2002

(54) STUD ASSEMBLY STRUCTURE OF COMPUTER MOTHER BOARD CAPABLE OF BEING ASSEMBLED BY AUTOMATIC MACHINE

(76) Inventor: Chiang Chun Lin, No. 9, Lane 90, Fu Hsing Rd., Lu Chou, Taipei Hsien (TW)

( * ) Notice: Subject to any disclaimer, the term of this patent is extended or adjusted under 35 U.S.C. 154(b) by 0 days.

(21) Appl. No.: 09/586,878

(22) Filed: Jun. 5, 2000

(51) Int. Cl.[7] .............................................. H01B 17/00
(52) U.S. Cl. .............................. 174/138 D; 174/138 G; 361/742; 206/706
(58) Field of Search .......................... 174/138 D, 138 E, 174/138 G, 265; 206/706; 211/41.17; 361/719, 720, 742

(56) References Cited

U.S. PATENT DOCUMENTS

| | | | | |
|---|---|---|---|---|
| 5,618,129 A | * | 4/1997 | Skarivoda | 403/389 |
| 5,671,124 A | * | 9/1997 | Ho | 361/758 |
| 5,724,229 A | * | 3/1998 | Tustaniwskyi et al. | 361/719 |
| 5,978,232 A | * | 11/1999 | Jo | 361/796 |
| 6,225,566 B1 | * | 5/2001 | Dienst | 174/138 E |

* cited by examiner

Primary Examiner—Dean A. Reichard
Assistant Examiner—W. David Walkenhorst
(74) Attorney, Agent, or Firm—Rosenberg, Klein & Lee

(57) ABSTRACT

A stud assembly structure of a computer mother board capable of being assembled by an automatic machine includes a screw hole and a quick detaching cover. The stud is provided to be inserted in each assembling hole in a mother board and a penetrating hole is installed therein. A circular buckling trench is installed at an outer periphery of the stud. The quick detaching cover has a cover piece for covering an opening of the screw hole of the stud. The periphery of the cover piece being formed with elastic clamping pieces extending toward the stud for clamping the stud so that the quick detaching cover is detachably assembled to the stud temporarily. Therefore, the stud with quick detaching cover is provided to a SMT automatic machine for absorbing the cover piece by vacuum for picking the stud to a predetermined position. Then, the stud is inserted into the assembling hole. Then, the stud is released so as to complete the assembly work. Therefore, the whole assembly work is quick, accurate and quick. As a result, the efficiency in the assembly is improved greatly.

3 Claims, 4 Drawing Sheets

STUD ASSEMBLY STRUCTURE OF COMPUTER MOTHER BOARD CAPABLE OF BEING ASSEMBLED BY AUTOMATIC MACHINE

FIELD OF THE INVENTION

The present invention relates to a stud assembly structure, and especially to a stud assembly structure of a computer mother board capable of being assembled by an automatic machine, which is installed at a proper place of a computer for isolating and combining a mother board with another objects, further, by a special design, the present invention can provide to a SMT automatic machine for improving the assembling efficiency with accuracy and high speed.

BACKGROUND OF THE INVENTION

In general, a plurality of assembling holes are formed on a mother board for being assembled with studs having screw holes so that an electronic device, or a circuit board installed above, or other objects can be assembled to the mother board by the isolation of the studs and then they are combined by screws. Although, in current technology, almost all the elements in a mother board are assembled by a SMT (surface mounting technology) automatic machine and then are welded to a mother board by tin. However, since the studs have screw holes, they cannot be picked up or inserted through vacuum absorption by a SMT automatic machine. Therefore, conventionally, the installation of studs are performed manually, one by one, and then the studs are inserted in the assembling holes of a mother board. Other than being time consuming, the working efficiency is low and accuracy and correction are also insufficient so that the stability is low. Although currently, in some application, a plastic plus is inserted in the screw hole of a stud in advance. By sealing the screw hole, the stud can be picked up or inserted through vacuum absorption by a SMT automatic machine. However, afterward, the plug must be picked out manually. Moreover, since the plastic plug is not a heat-tolerable material, thus in the tin welding process, it is easily melted and thus, is difficult to be removed in the picking process, making the screwed connection more difficult to accomplish.

Therefore, there is an eager demand for novel stud assembly structure of a computer mother board capable of being assembled by an automatic machine, thereby, the defects in the prior art can be improved greatly.

SUMMARY OF THE INVENTION

Accordingly, the primary object of the present invention is to provide a stud assembly structure of a computer mother board capable of being assembled by an automatic machine, wherein a stud with quick detaching cover is provided to a SMT automatic machine for absorbing the cover piece by vacuum for picking the stud to a predetermined position then, the stud is inserted into the assembling hole, and the stud is released so as to complete the assembly work. Therefore, the whole assembly work is accurate and quick. As a result, the efficiency in the assembly is improved greatly.

A further object of the present invention is to provide a stud assembly structure of a computer mother board capable of being assembled by an automatic machine, wherein a circular buckling trench is installed at an outer periphery of the stud. A quick detaching cover has a cover piece for covering an opening of the screw hole of the stud. The periphery of the cover piece is formed with elastic clamping pieces extending toward the stud for clamping the stud so that the quick detaching cover is detachably assembled to the stud temporarily. The stud can be removed in an SMT operation easily. Thereby, the aforesaid function can be achieved easily.

The various objects and advantages of the present invention will be more readily understood from the following detailed description when read in conjunction with the appended drawing.

DETAILED DESCRIPTION OF THE PREFERRED EMBODIMENTS

Figure 2:
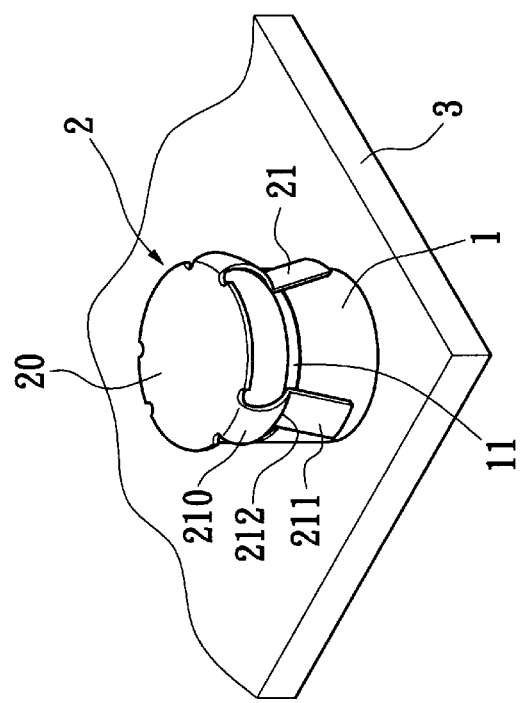
FIG. 2 is a lateral view of a stud according to the present invention.
Figure 1:
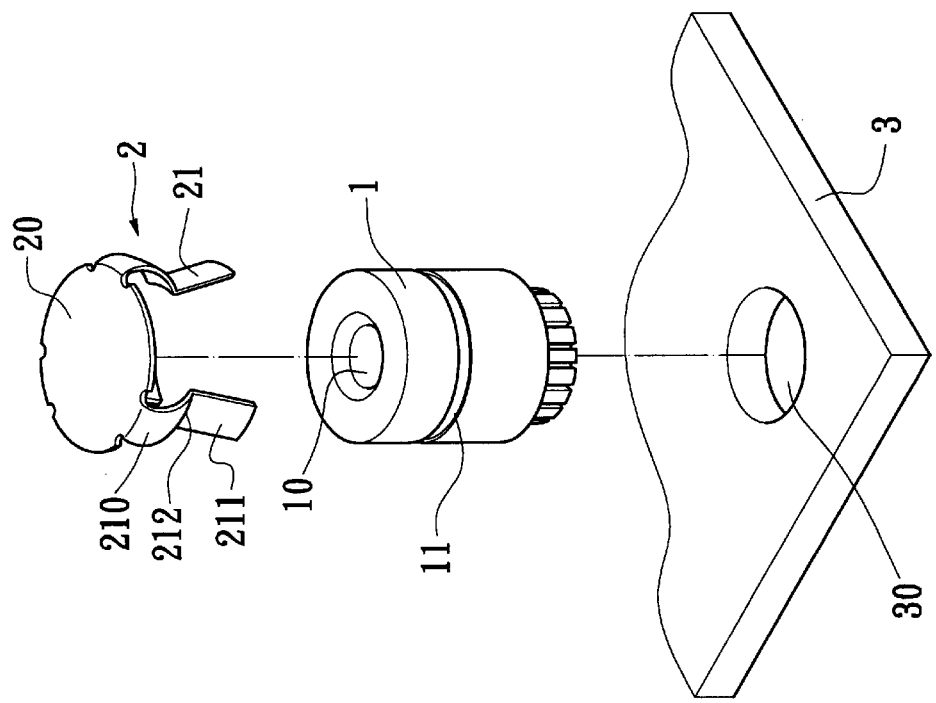
FIG. 1 is an exploded perspective view of the present invention.

With reference to FIGS. 1 and 2, a stud assembly structure of a computer mother board capable of being assembled by an automatic machine according to the present invention is illustrated. The stud assembly structure includes a stud 1 and a quick detaching cover 2.

The stud 1 is provided to be inserted in each assembling hole 30 preset in a mother board 3. A screw hole 10 is installed therein and a circular buckling trench 11 is installed at a proper place at the outer periphery of the stud.

The quick detaching cover 2 has a cover piece 20 for covering the opening of the screw hole 10 of the stud 1. The periphery of the cover piece 20 is formed with at least two elastic clamping pieces 21 extending toward the stud 1 (in this embodiment, three elastic clamping pieces spaced with an equal angle are formed). Each elastic clamping piece 21 is formed with a "<" shape and has an enclosing clamping portion 210 and an outer movable portion 211. An embedding clamping portion 212 capable of embedded a circular buckling trench 11 is formed in the bending portion between the enclosing clamping portion 210 and the outer movable portion 211.

Figure 4:
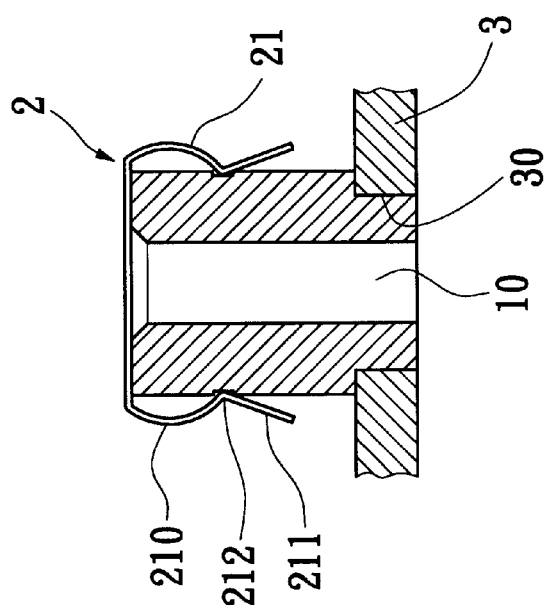
FIG. 4 is a lateral cross sectional view showing the present invention being assembled in a mother board.
Figure 3:
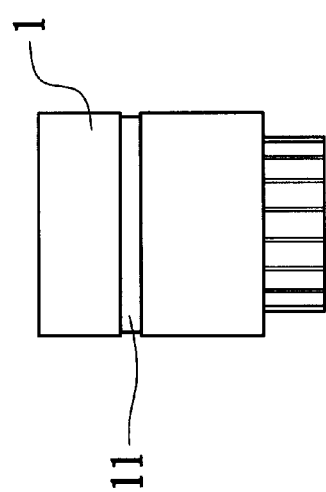
FIG. 3 is a perspective view showing the present invention being assembled in a mother board.

Therefore, before assembling the stud 1 tot he assembling hole 30 of the mother board 3, the quick detaching cover 2 is in advance pressed into the stud 1 so that the cover piece 20 can be adhered to the stud 1 to seal the screw hole 10, while the embedding clamping portion 212 is embedded in the circular buckling trench 11. Thus, the quick detaching cover 2 can be combined to the stud 1 temporarily. Therefore, the stud 1 with quick detaching cover 2 is provided to a SMT automatic machine for absorbing the cover piece 20 by vacuum for picking the stud to a predetermined position. Then the stud is inserted into the assembling hole 30. Then, the stud is released so as to complete the assembly work, as shown in FIGS 3 and 4. Therefore, the whole assembly work is accurate and quick. As a result, the efficiency in the assembly is improved greatly. On the other hand, when the mother board passes through a tin furnace is a SMT welding operation, the physical property of the quick detaching cover is not affected and the stability in the clamping operation is not affected. After performing the SMT operation, it is only needed to use a proper tool to move the outer movable portion 211 upwards, then, the quick detaching cover 2 can be removed completely to restore the stud 1 to its original condition. Consequently, the screwed connecting afterwards can be performed for isolation from or combining to the mother board 3 or other articles.

Figure 5:
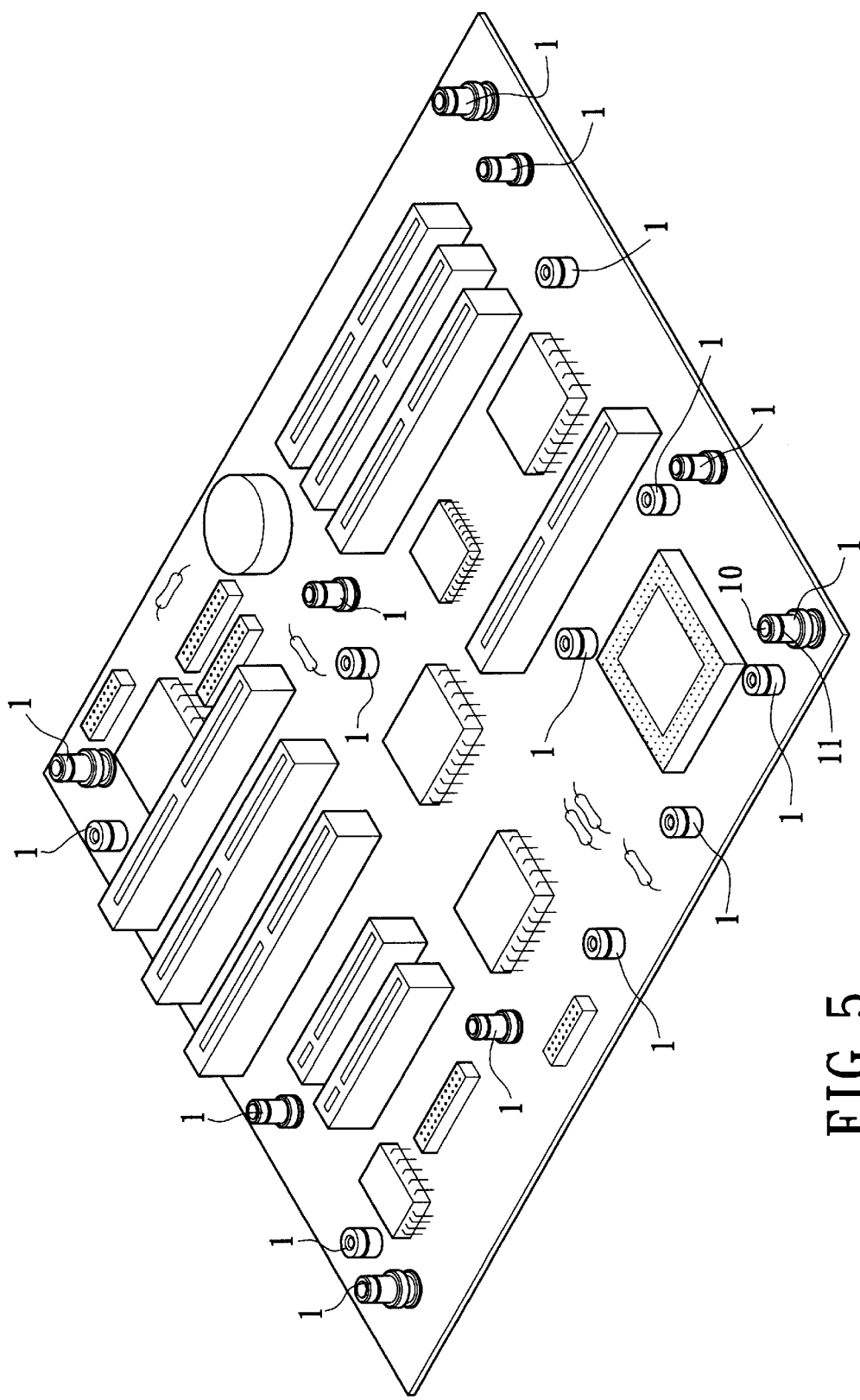
FIG. 5 is a schematic cross sectional view showing studs of various types according to the present invention being inserted in a mother board.
Figure 7:
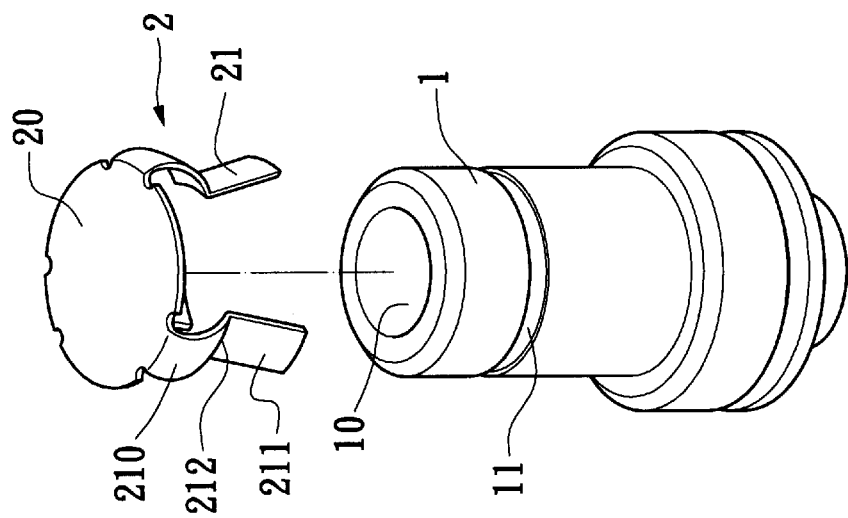
FIG. 7 is an exploded structural perspective view showing another embodiment about the shape of another stud structure according to the present invention.
Figure 6:
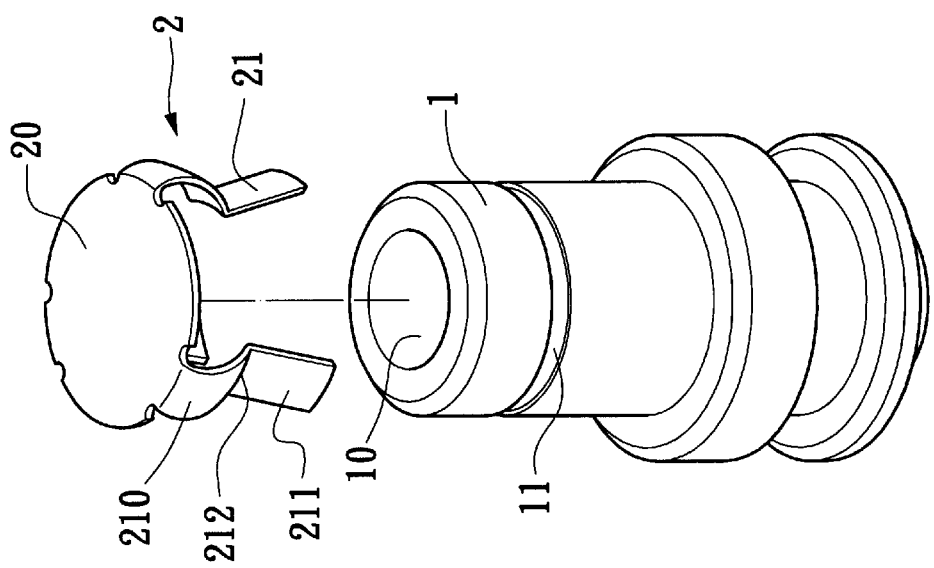
FIG. 6 is an exploded structural perspective view showing an embodiment about the shape of another stud structure according to the present invention.

Besides, in order to be suitable in the isolation and combination operations in different articles and mother board 3, the structures and shapes of the studs on the mother board 3 have various designs, as shown in FIG. 5. The embodiment shown in FIGS. 1 to 4 can be applied to the peripherals of CPUs. FIGS. 6 and 7 shows embodiments suitable to be used in other electronic devices. Despite of the structure and shapes of the studs, that disclosed in the aforesaid description is suitable to these studs so as to be beneficial in an automatic operation.

Furthermore, general studs can be used instead of the studs with the circular buckling trench 11. An elastic clamping piece 21 with enhancing clamping force can steadily clamp a prior art stud in position. Furthermore, a stud 1 without any circular buckling trench but with a width upper portion and a thinner lower portion is also suitable to retain the clamping effect of an elastic clamping piece 21.

In summary, the stud assembly structure of a computer mother board assembled by an automatic machine disclosed in the present invention have substantially overcome the defects in the prior art problem in the assembling process. Therefore, the present invention is a novel design meeting the requirement of inventive step.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A stud assembly structure of a computer mother board for assembly by an automatic machine, comprising:

a stud for insertion in a respective assembling hole in a mother board, said stud having a screw hole formed therein; and, a quick detaching cover having an imperforate piece for covering an opening of the screw hole of the stud, a periphery of said cover piece being formed with at least two elastic clamping pieces extending toward the stud for detachably clamping the stud, whereby said quick detaching cover enables an automatic machine to pick-up said stud using vacuum.

2. A stud assembly structure of a computer mother board for assembly by an automatic machine, comprising:

a stud for insertion in a respective assembling hole in a mother board, said stud having a screw hole formed therein and a circular buckling trench formed in an outer periphery of the stud; and, a quick detaching cover having a piece for covering an opening of the screw hole of the stud, a periphery of the cover piece being formed with at least two elastic clamping pieces extending toward the stud for detachably engaging said circular buckling trench.

3. The stud assembly structure of a computer mother board for assembly by an automatic machine as claimed in claim 2, wherein each elastic clamping piece is formed with a V-shaped embedding clamping portion and has an enclosing clamping portion and an outer movable portion, said embedding clamping portion being engageable in said circular buckling trench, said embedding clamping portion being formed between said enclosing clamping portion and said outer movable portion.

* * * * *